United States Patent
Nishida et al.

(10) Patent No.: US 11,408,069 B2
(45) Date of Patent: Aug. 9, 2022

(54) METHOD FOR PRODUCING METALLIC RUTHENIUM THIN FILM BY ATOMIC LAYER DEPOSITION

(71) Applicant: ADEKA CORPORATION, Tokyo (JP)

(72) Inventors: Akihiro Nishida, Tokyo (JP); Masaki Enzu, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 17/291,446

(22) PCT Filed: Oct. 28, 2019

(86) PCT No.: PCT/JP2019/042131
§ 371 (c)(1),
(2) Date: May 5, 2021

(87) PCT Pub. No.: WO2020/095744
PCT Pub. Date: May 14, 2020

(65) Prior Publication Data
US 2022/0002867 A1    Jan. 6, 2022

(30) Foreign Application Priority Data
Nov. 8, 2018 (JP) .............................. JP2018-210356

(51) Int. Cl.
*C23C 16/455* (2006.01)
*C23C 16/18* (2006.01)

(52) U.S. Cl.
CPC ........ *C23C 16/45527* (2013.01); *C23C 16/18* (2013.01)

(58) Field of Classification Search
CPC .. C23C 16/18; C23C 16/45525–45527; C23C 16/06; C23C 16/08; C23C 16/16
See application file for complete search history.

(56) References Cited

U.S. PATENT DOCUMENTS

2012/0107502 A1* 5/2012 Thompson ............. C07C 211/13
427/250
2020/0339617 A1* 10/2020 Kim .................. C23C 16/45553

FOREIGN PATENT DOCUMENTS

JP          2013-36054       2/2013

OTHER PUBLICATIONS

International Search Report dated Dec. 24, 2019 in International (PCT) Application No. PCT/JP2019/042131.

* cited by examiner

*Primary Examiner* — Elizabeth A Burkhart
(74) *Attorney, Agent, or Firm* — Wenderoth, Lind & Ponack, L.L.P.

(57) ABSTRACT

A method of the present invention for producing a metallic ruthenium thin film on a substrate by atomic layer deposition includes: (A) a step of introducing a feedstock gas containing a specific ruthenium compound into a treatment atmosphere, and allowing the ruthenium compound to deposit on the substrate; and a step of introducing a reactive gas containing a specific compound into the treatment atmosphere, and allowing the reactive gas to react with the specific ruthenium compound deposited on the substrate.

8 Claims, 5 Drawing Sheets

[Fig.1]
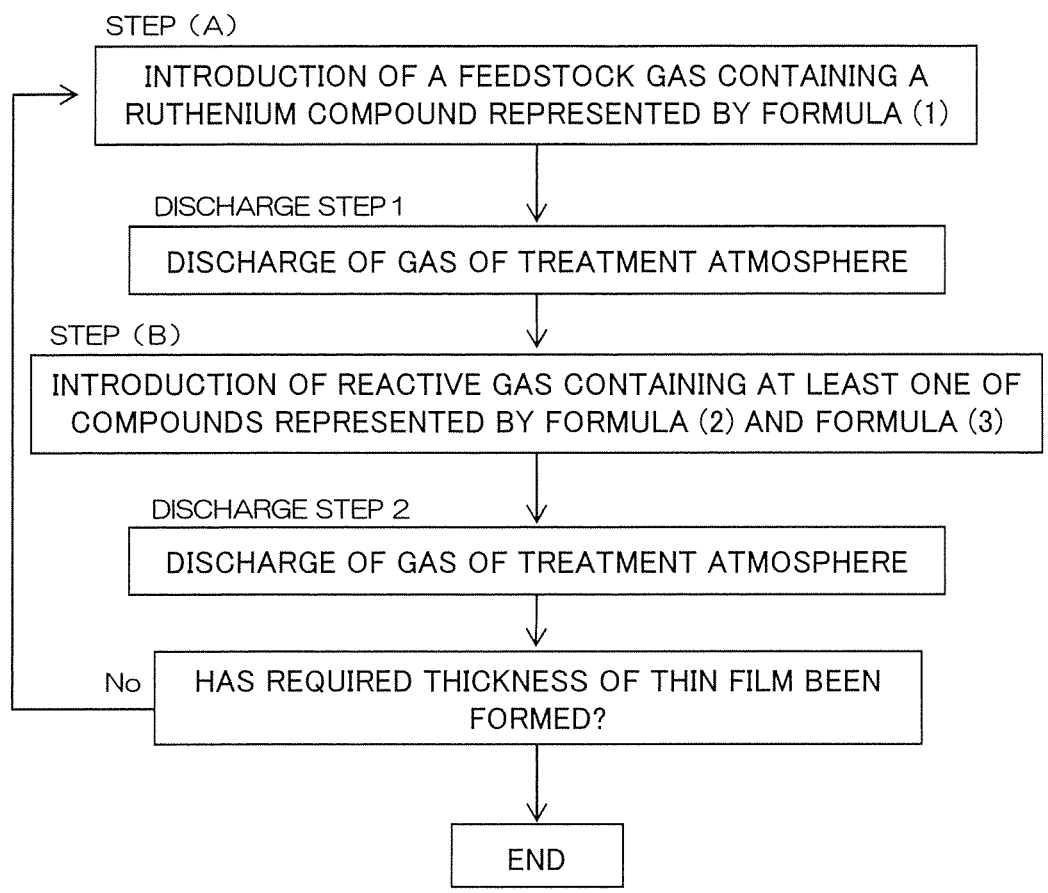

[Fig. 2]
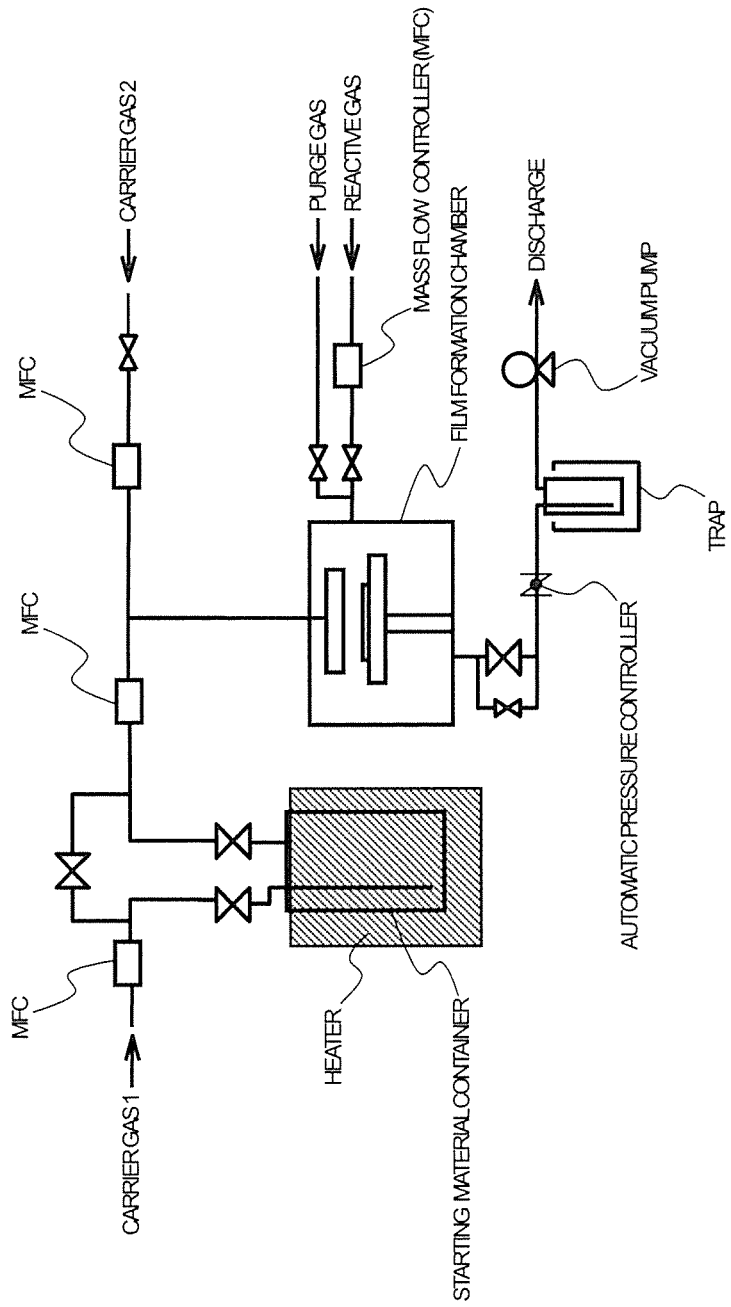

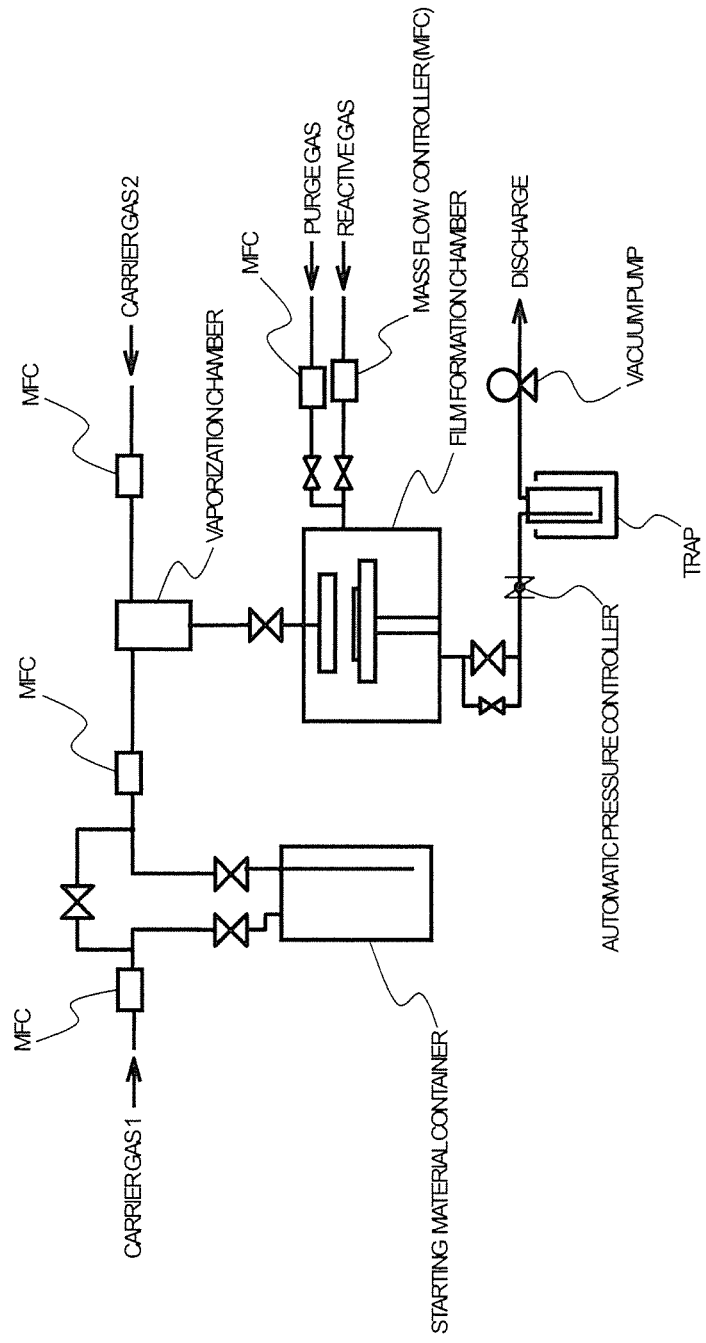

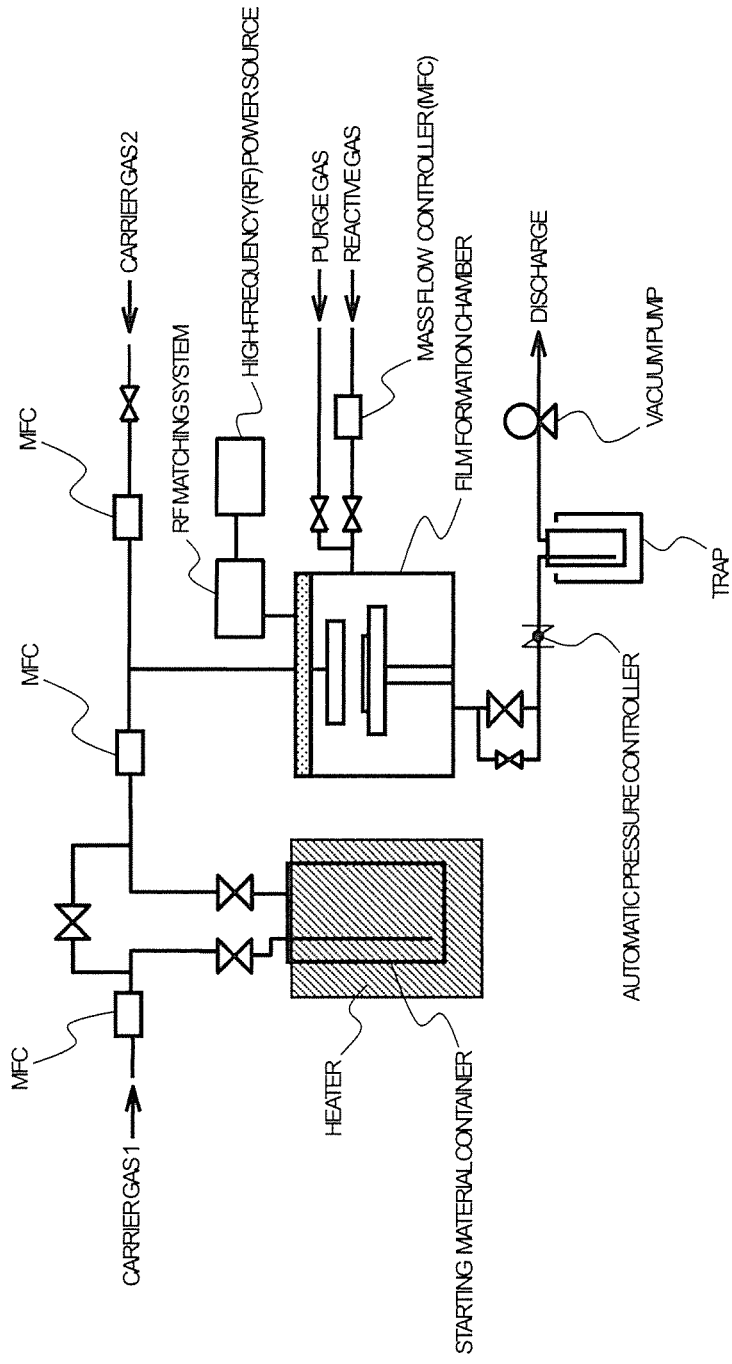
[Fig. 4]

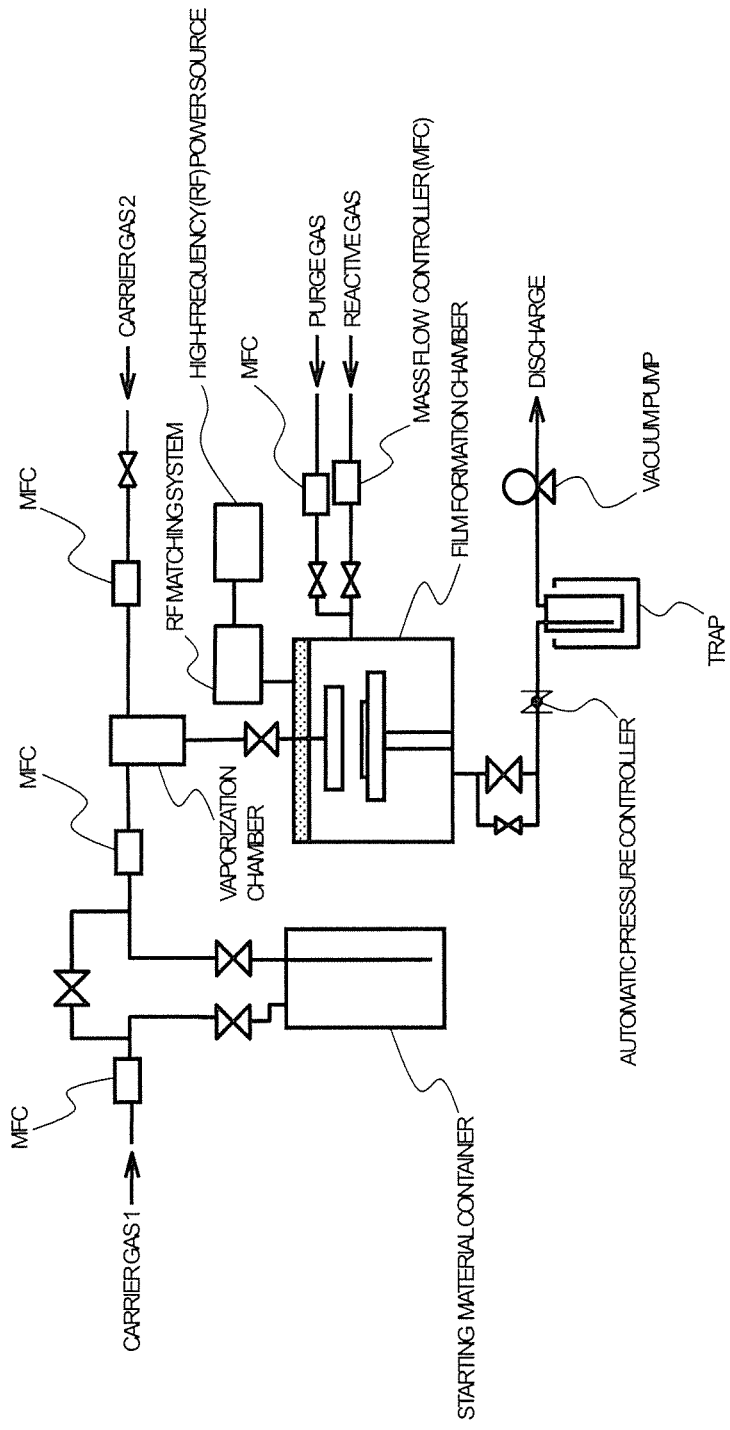
[Fig. 5]

METHOD FOR PRODUCING METALLIC RUTHENIUM THIN FILM BY ATOMIC LAYER DEPOSITION

TECHNICAL FIELD

The present invention relates to a method for producing a metallic ruthenium thin film by atomic layer deposition.

BACKGROUND ART

Metallic ruthenium thin films, which exhibit unique electrical characteristics, are used in various applications. For instance, metallic ruthenium thin films are used as electrode materials for memory elements typified by DRAM elements, resistor films, diamagnetic films used for recording layers of hard disks, and catalyst materials for solid polymer fuel cells.

Production methods of the above thin films include sputtering, ion plating, MOD methods such as coating/thermal decomposition and sol-gel methods, CVD, and atomic layer deposition (hereafter also notated as ALD), among which mainly CVD and ALD are utilized, since these afford favorable quality in an obtained thin film.

Conventionally, various ruthenium compounds are known as ruthenium compounds to be utilized as starting materials for CVD and as starting materials for ALD. For instance, Patent Literature 1 discloses dodecacarbonyltriruthenium, which has a simple molecular structure made up of ruthenium and CO. However, in a case where dodecacarbonyltriruthenium is used as a starting material for ALD to produce a metallic ruthenium thin film and where ozone or hydrogen is used as a reactive gas, the obtained thin film is a composite film of metallic ruthenium and ruthenium oxide, and accordingly this requires a step in which the obtained thin film is reduced into metallic ruthenium through heating at high temperature.

CITATION LIST

Patent Literature

[PTL 1] Japanese Patent Application Publication No. 2013-036054

SUMMARY OF INVENTION

Technical Problem

When attempting to produce a metallic ruthenium thin film by ALD in accordance with a conventionally known method, the obtained thin film ends up being a composite film of metallic ruthenium and ruthenium oxide, and accordingly this requires a step in which the obtained thin film is reduced into metallic ruthenium through heating at high temperature. This step may significantly damage surrounding members, and hence a method for producing a metallic ruthenium thin film is demanded in which the obtained thin film does not form a composite film of metallic ruthenium and ruthenium oxide, whereby a metallic ruthenium thin film can be obtained.

Therefore, it is an object of the present invention to provide a production method for obtaining a metallic ruthenium thin film of favorable quality by atomic layer deposition.

Solution to Problem

As a result of diligent research, the inventors of the present invention have found that the above issue can be solved by a method for producing a metallic ruthenium thin film by atomic layer deposition having specific steps, and arrived at the present invention on the basis of that finding.

Specifically, the present invention provides a method for producing a metallic ruthenium thin film on a substrate by atomic layer deposition, the method comprising:

(A) a step of introducing a feedstock gas containing a ruthenium compound represented by Formula (1) into a treatment atmosphere, and allowing the ruthenium compound represented by Formula (1) to deposit on the substrate; and (B) a step of introducing a reactive gas containing at least one of the compounds represented by Formula (2) and Formula (3) into the treatment atmosphere, and allowing the reactive gas to react with the ruthenium compound represented by Formula (1) deposited on the substrate.

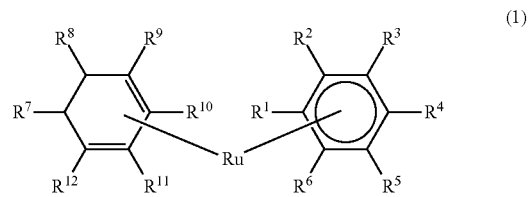

(1)

(in the formula, $R^1$ to $R^{12}$ each independently represent hydrogen or a C1 to C5 alkyl group)

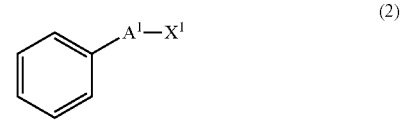

(2)

(in the formula, $A^1$ represents a C1 to C5 alkanediyl group, and $X^1$ represents a halogen atom)

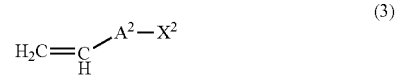

(3)

(in the formula, $A^2$ represents a C1 to C5 alkanediyl group, and $X^2$ represents a halogen atom)

Advantageous Effects of Invention

The present invention allows the production of a metallic ruthenium thin film of good quality by atomic layer deposition.

BRIEF DESCRIPTION OF DRAWINGS

FIG. 1 is a flowchart illustrating an example of a method for producing a metallic ruthenium thin film according to the present invention.

FIG. 2 is a schematic diagram illustrating an example of an ALD apparatus used in the method for producing a metallic ruthenium thin film according to the present invention.

FIG. 3 is a schematic diagram illustrating another example of an ALD apparatus used in the method for producing a metallic ruthenium thin film according to the present invention.

FIG. 4 is a schematic diagram illustrating another example of an ALD apparatus used in the method for producing a metallic ruthenium thin film according to the present invention.

FIG. 5 is a schematic diagram illustrating another example of an ALD apparatus used in the method for producing a metallic ruthenium thin film according to the present invention.

DESCRIPTION OF EMBODIMENTS

A procedure similar to those of known ordinary atomic layer deposition methods can be resorted to in the method for producing a metallic ruthenium thin film by atomic layer deposition of the present invention, but as a characterizing feature of the method of the present invention, it is essential that the method combines step (A) and step (B) described below.

Step (A) of the production method of the present invention is a step of introducing a feedstock gas containing a ruthenium compound represented by Formula (1) into a treatment atmosphere, and allowing the ruthenium compound represented by Formula (1) to deposit on a substrate. The concept denoted by the term "deposition" encompasses adsorption of the ruthenium compound represented by Formula (1) onto the substrate. A feedstock gas containing a ruthenium compound represented by Formula (1) is used in step (A); in combination with step (B), this allows producing a metallic ruthenium thin film of high purity. The feedstock gas containing the ruthenium compound represented by Formula (1) in this step contains preferably 90 vol % or more, and more preferably 99 vol % or more, of the ruthenium compound represented by Formula (1).

In Formula (1), $R^1$ to $R^{12}$ each independently represent hydrogen or a C1 to C5 alkyl group.

In Formula (1), examples of the C1 to C5 alkyl group represented by $R^1$ to $R^{12}$ include methyl, ethyl, n-propyl, isopropyl, n-butyl, secondary butyl, tertiary butyl, isobutyl, n-pentyl, secondary pentyl, tertiary pentyl, isopentyl and neopentyl.

Preferably combinations of $R^1$ to $R^{12}$ in Formula (1) are liquid at normal temperature and under normal pressure, and exhibit high vapor pressure. Specifically, $R^2$, $R^3$, $R^4$, $R^5$, $R^6$, $R^7$, $R^8$, $R^9$, $R^{11}$ and $R^{12}$ are preferably hydrogen, and $R^1$ and $R^{10}$ are preferably methyl, ethyl, propyl or isopropyl, since in that case vapor pressure is high, with isopropyl being particularly preferred among the foregoing.

Further, $R^1$ and $R^{10}$ are preferably methyl, $R^2$, $R^4$, $R^5$, $R^6$, $R^7$, $R^8$, $R^9$ and $R^{11}$ are preferably hydrogen, and $R^3$ and $R^{12}$ are preferably methyl, ethyl, propyl or isopropyl, since in that case vapor pressure is high, with methyl or ethyl being particularly preferred among the foregoing.

Further, $R^1$ and $R^{10}$ are preferably methyl, $R^2$, $R^3$, $R^5$, $R^6$, $R^8$, $R^9$, $R^{11}$ and $R^{12}$ are preferably hydrogen, and $R^4$ and $R^7$ are preferably methyl, ethyl, propyl or isopropyl, since in that case vapor pressure is high, with isopropyl being particularly preferred among the foregoing.

Particularly, among the foregoing $R^1$ and $R^{10}$ are preferably methyl, $R^2$, $R^3$, $R^5$, $R^6$, $R^8$, $R^9$, $R^{11}$ and $R^{12}$ are preferably hydrogen, and $R^4$ and $R^7$ are preferably isopropyl, since in that case the effect of achieving good purity in the obtained metallic ruthenium thin film is pronounced.

Preferred concrete examples of the ruthenium compound represented by Formula (1) include Compounds No. 1 to No. 21 below.

In the chemical formulae below, "Me" represents a methyl group, "Et" represents an ethyl group, and "iPr" represents an isopropoxy group.

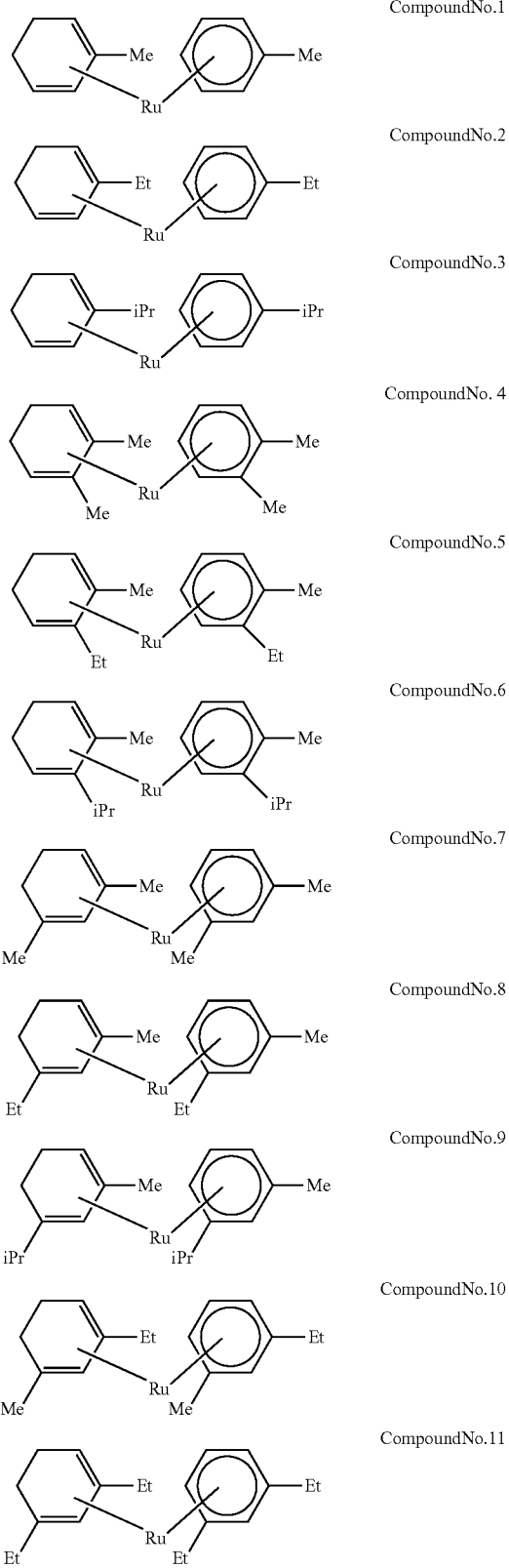

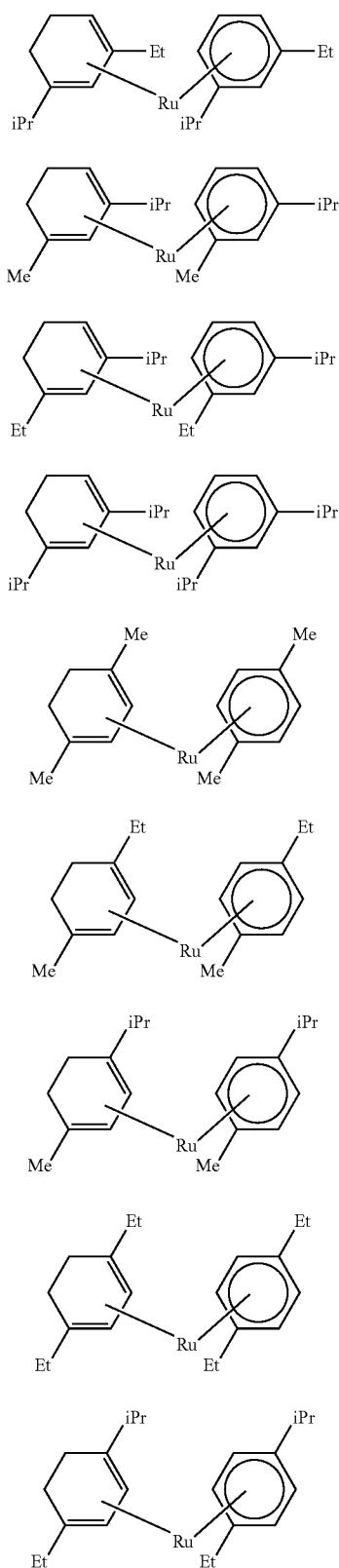

CompoundNo.12
CompoundNo.13
CompoundNo.14
CompoundNo.15
CompoundNo.16
CompoundNo.17
CompoundNo.18
CompoundNo.19
CompoundNo.20

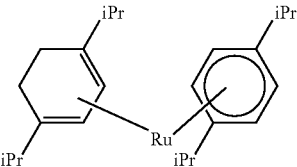

CompoundNo.21

The method for producing the ruthenium compound represented by Formula (1) is not particularly limited, and the ruthenium compound can be produced in accordance with a known synthesis method. For instance, the ruthenium compound can be obtained in accordance with a method that involves allowing ruthenium(III) chloride to react with a cyclohexadiene compound having a corresponding structure, in the presence of zinc. This synthesis method is disclosed in for instance, the Journal of the Chemical Society, Dalton Transactions, No. 10, 1980, 1961-1964. A commercially available ruthenium compound can likewise be used.

The method for vaporizing the ruthenium compound represented by Formula (1) in step (A) is not particularly limited, and for instance a known vaporization method of organometallic compounds utilized in atomic layer deposition can be used herein. For instance, vaporization can be accomplished through heating and depressurization in a starting material container of the ALD apparatuses illustrated in FIG. 2 to FIG. 5. The temperature at the time of heating lies preferably in the range from 20° C. to 200° C. In step (A), the temperature of the substrate at the time of deposition of the vaporized ruthenium compound represented by Formula (1) on the substrate lies preferably in the range from 100° C. to 500° C., and is more preferably from 150° C. to 350° C.

Examples of the material of the substrate that can be used in the production method of the present invention include for instance silicon; ceramics such as indium arsenide, indium gallium arsenide, silicon oxide, silicon nitride, silicon carbide, aluminum oxide, aluminum nitride, tantalum oxide, tantalum nitride, titanium oxide, titanium nitride, titanium carbide, zirconium oxide, hafnium oxide, lanthanum oxide and gallium nitride; glass; and metals such as platinum, aluminum, copper, nickel, cobalt, tungsten and molybdenum. The shape of the substrate may be plate-like, spherical, fibrous or scaly. The substrate surface may be flat, or may adopt a three-dimensional structure such as a trench structure.

Step (B) of the production method of the present invention is a step of introducing, into a treatment atmosphere, a reactive gas containing at least one of the compounds represented by Formula (2) and by Formula (3), and allowing the reactive gas to react with the ruthenium compound represented by Formula (1) deposited on the substrate. A metallic ruthenium thin film of good quality can be efficiently produced through the use, in step (B), of the ruthenium compound represented by Formula (1), and the reactive gas containing at least one of the compounds represented by Formula (2) or by Formula (3).

In Formula (2), $A^1$ represents a C1 to C5 alkanediyl group, and $X^1$ represents a halogen atom.

In Formula (2), examples of the C1 to C5 alkanediyl group represented by $A^1$ include methylene, ethylene, propylene, methylethylene, butylene, 1-methyl propylene, 2-methyl propylene, 1,2-dimethyl propylene, 1,3-dimethyl propylene, 1-methylbutylene, 2-methylbutylene, 3-methylbutylene, 4-methylbutylene and the like.

In Formula (2), examples of the halogen atom represented by $X^1$ include fluorine atoms, chlorine atoms, bromine atoms, iodine atoms and astatine atoms.

Preferably, combinations of $A^1$ and $X^1$ in Formula (2) result in high vapor pressure and good reactivity with the ruthenium compound represented by Formula (1). Specifically, $A^1$ is preferably methylene, ethylene, propylene, methylethylene, butylene, 1-methyl propylene, 2-methyl propylene, 1,2-dimethyl propylene or 1,3-dimethyl propylene; preferred among the foregoing are methylene, ethylene and propylene, since the reactivity of the foregoing with the ruthenium compound represented by Formula (1) is good, and particularly preferably methylene, since in that case vapor pressure is high.

Further, $X^1$ is preferably a fluorine atom, a chlorine atom or a bromine atom, and preferably among the foregoing a chlorine atom or a bromine atom.

Preferred concrete examples of the compound represented by Formula (2) include Compounds No. 22 to No. 27.

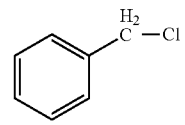
CompoundNo.22

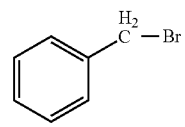
CompoundNo.23

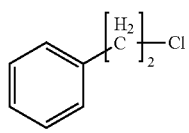
CompoundNo.24

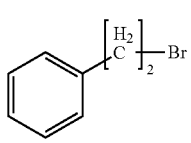
CompoundNo.25

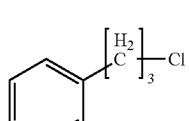
CompoundNo.26

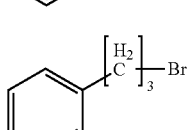
CompoundNo.27

In Formula (3), $A^2$ represents a C1 to C5 alkanediyl group, and $X^2$ represents a halogen atom.

In Formula (3), examples of the C1 to C5 alkanediyl group represented by $A^2$ include methylene, ethylene, propylene, methylethylene, butylene, 1-methyl propylene, 2-methyl propylene, 1,2-dimethyl propylene, 1,3-dimethyl propylene, 1-methylbutylene, 2-methylbutylene, 3-methylbutylene, 4-methylbutylene and the like.

In Formula (3), examples of the halogen atom represented by $X^2$ include fluorine atoms, chlorine atoms, bromine atoms, iodine atoms and astatine atoms.

Preferably, combinations of $A^2$ and $X^2$ in Formula (3) result in high vapor pressure and good reactivity with the ruthenium compound represented by Formula (1). Specifically, $A^2$ is preferably methylene, ethylene, propylene, methylethylene, butylene, 1-methyl propylene, 2-methyl propylene, 1,2-dimethyl propylene or 1,3-dimethyl propylene; preferred among the foregoing are methylene, ethylene and propylene, since these exhibit good reactivity with the ruthenium compound represented by Formula (1), and particularly preferably methylene, since in that case vapor pressure is high.

Preferably, $A^2$ is a fluorine atom, a chlorine atom or a bromine atom, since these exhibit good reactivity with the ruthenium compound represented by Formula (1), and among the foregoing $A^2$ is preferably a chlorine atom or a bromine atom.

Preferred concrete examples of the compound represented by Formula (3) include Compounds No. 28 to No. 33.

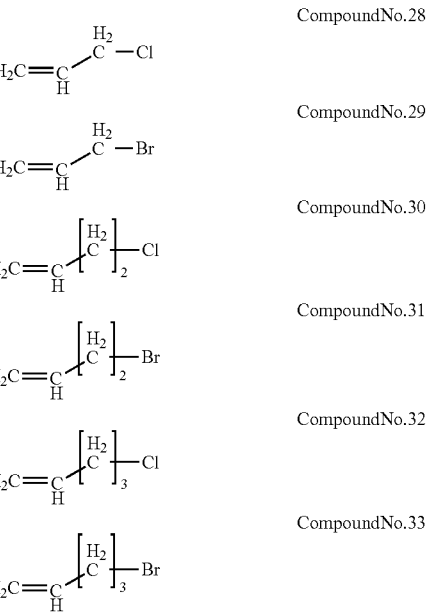

The reactive gas containing at least one of the compounds represented by Formula (2) or by Formula (3) can be made up of only a compound represented by Formula (2), or can be made up of only a compound represented by Formula (3), and may be a mixed gas of a compound represented by Formula (2) and a compound represented by Formula (3). Further, the reactive gas may be a mixed gas of the foregoing gases and a gas such as argon, nitrogen, oxygen or hydrogen.

The method for introducing, into a treatment atmosphere, the reactive gas containing a compound represented by Formula (2) and/or represented by Formula (3) in step (B) is not particularly limited, and the reactive gas can be introduced in accordance with a known reactive gas introduction method used in general atomic layer deposition; however, preferably a reactive gas having been vaporized beforehand is introduced into the treatment atmosphere.

For instance, a method for producing a metallic ruthenium thin film on a silicon substrate in accordance with the production method of the present invention will be explained next with reference to the flowchart of FIG. 1. The ALD apparatus illustrated in FIG. 2 will be used herein.

First, the silicon substrate is installed within a film formation chamber. The method for installing the silicon substrate is not particularly limited, and the substrate may be installed in the film formation chamber by resorting to a known general method. The ruthenium compound represented by Formula (1) is vaporized within a starting material container, and the vaporized ruthenium compound is introduced into the film formation chamber, and is allowed to deposit (adsorb) on the silicon substrate having been heated at 100° C. to 500° C., preferably at 150° C. to 350° C. (step (A)).

Next the ruthenium compound represented by Formula (1) not having deposited on the silicon substrate is discharged from the film formation chamber (discharge step 1). Ideally the ruthenium compound represented by Formula (1) that has not deposited on the silicon substrate is completely discharged from the film formation chamber; however, the ruthenium compound need not necessarily be discharged completely. Examples of the discharge method include methods for purging the interior of the system with an inert gas such as helium or argon, discharge methods by depressurizing the interior of the system, and methods that combine the foregoing. Preferably, the degree of vacuum in the case of depressurizing is preferably from 0.01 to 300 Pa, more preferably from 0.1 to 100 Pa.

Next, the reactive gas containing at least one of the compounds represented by Formula (2) or by Formula (3) is introduced into the film formation chamber, and is allowed to react with the ruthenium compound represented by Formula (1) deposited on the silicon substrate (step (B)). Herein it is preferable that the reactive gas containing at least one of the compounds represented by Formula (2) or Formula (3) be vaporized beforehand and introduced in a gaseous state. The temperature at which heat is applied in this step lies preferably in the range from 100° C. to 500° C., and is 150° C. to 350° C. The difference between the silicon substrate temperature in step (A) and the temperature of heat application in step (B) lies preferably in the range from 0° C. to 20° C., in absolute value. That is because it is deemed that by performing an adjustment to within the above range an effect is elicited whereby warping of the metallic ruthenium thin film is unlikelier to occur.

Next, unreacted reactive gas containing at least one of the compounds represented by Formula (2) or Formula (3) plus by-product gases are discharged out of the film formation chamber (discharge step 2). Ideally, the unreacted reactive gas containing at least one of the compounds represented by Formula (2) or Formula (3) plus by-product gases are discharged completely out of the reaction chamber, but this does not necessarily be the case. Examples of the discharge method include methods for purging the interior of the system with an inert gas such as helium or argon, discharge methods by depressurizing the interior of the system, and methods that combine the foregoing. Preferably, the degree of vacuum in the case of depressurizing is preferably from 0.01 to 300 Pa, more preferably from 0.1 to 100 Pa.

Taking, as one cycle, deposition of a thin film as a result of the series of operations made up of the above step (A), the discharge step 1, step (B) and discharge step 2, such a film formation cycle may be repeated a plurality of times until there is obtained a metallic ruthenium thin film having the necessary film thickness.

After the above step (B), a reducing gas such as hydrogen gas may be introduced as a reactive gas, and the same operation as in step (B) and the discharge step 2 may be carried out.

Energy such as plasma, light or voltage may be applied in the production method of the present invention. The timing of application of these kinds of energy is not particularly limited, and for instance the energy may be applied at the time of introduction of the gas of the ruthenium compound gas represented by Formula (1) in step (A), at the time of heating in step (B), or at the time of purging of the system in the discharge step, and may be applied at timings between these steps.

In the production method of the present invention an annealing treatment may be performed in an inert gas atmosphere or a reducing gas atmosphere, after deposition of the thin film, in order to achieve better film quality; also a reflow step may be provided in a case where gap filling is necessary. The temperature in this case is 400° C. to 1200° C., preferably 500° C. to 800° C.

A known ALD apparatus can be used as the apparatus for producing the metallic ruthenium thin film according to the present invention. Concrete examples of apparatuses include an apparatus that allows bubbling and supplying of starting materials for atomic layer deposition, such as that illustrated in FIG. 2, or an apparatus having a vaporization chamber, as illustrated in FIG. 3. Other examples include apparatuses in which a reactive gas can be subjected to a plasma treatment, such as those illustrated in FIG. 4 and FIG. 5. The apparatus is not limited to single wafer-type apparatuses such as those illustrated in FIG. 2 to FIG. 5, and for instance an apparatus can be used that allows processing simultaneously multiple wafers using a batch furnace.

EXAMPLES

The present invention will be explained next in further detail on the basis of the examples and comparative examples. However, the present invention is not meant to be limited in any way to the examples and so forth illustrated below.

[Examples 1 to 16] Production of Metallic Ruthenium Thin Films

Metallic ruthenium thin films were produced on a silicon wafer, by ALD, under the conditions given below, using the apparatus illustrated in FIG. 2. Table 1 sets out the feedstock gases and reactive gases that were used.

TABLE 1

|  | Feedstock gas | Reactive gas |
| --- | --- | --- |
| Example 1 | Compound No. 3 | Compound No. 22 |
| Example 2 | Compound No. 3 | Compound No. 23 |
| Example 3 | Compound No. 3 | Compound No. 28 |
| Example 4 | Compound No. 3 | Compound No. 29 |
| Example 5 | Compound No. 7 | Compound No. 22 |
| Example 6 | Compound No. 7 | Compound No. 23 |
| Example 7 | Compound No. 7 | Compound No. 28 |
| Example 8 | Compound No. 7 | Compound No. 29 |
| Example 9 | Compound No. 10 | Compound No. 22 |
| Example 10 | Compound No. 10 | Compound No. 23 |
| Example 11 | Compound No. 10 | Compound No. 28 |
| Example 12 | Compound No. 10 | Compound No. 29 |
| Example 13 | Compound No. 18 | Compound No. 22 |
| Example 14 | Compound No. 18 | Compound No. 23 |
| Example 15 | Compound No. 18 | Compound No. 28 |
| Example 16 | Compound No. 18 | Compound No. 29 |

(Conditions)
Reaction temperature (silicon wafer temperature): 300° C.

There were repeated 50 cycles, each being a series of steps consisting of (1) to (4) below:

(1) a starting material for atomic layer deposition, vaporized under conditions of starting material container temperature of 150° C. and starting material container internal pressure of 100 Pa, is introduced into a film formation chamber, and is allowed to deposit for 0.2 seconds under a system pressure of 100 Pa.

(2) starting material that has not deposited is removed by argon purging for 15 seconds;

(3) a reactive gas is introduced into the film formation chamber, and a reaction is allowed to proceed for 0.2 seconds under a system pressure of 100 Pa.

(4) unreacted reactive gas and by-product gases are removed by argon purging for 30 seconds.

[Comparative Examples 1 to 12] Production of Metallic Ruthenium Thin Films

Thin films were produced in the same way as in Example 1, but with the combinations of feedstock gas and reactive gas given in Table 2. Comparative compound 1 is dodecacarbonyltriruthenium.

TABLE 2

| | Feedstock gas | Reactive gas |
|---|---|---|
| Comp. example 1 | Compound No. 3 | Ozone gas |
| Comp. example 2 | Compound No. 4 | Ozone gas |
| Comp. example 3 | Compound No. 5 | Ozone gas |
| Comp. example 4 | Compound No. 9 | Ozone gas |
| Comp. example 5 | Compound No. 3 | Hydrogen gas |
| Comp. example 6 | Compound No. 4 | Hydrogen gas |
| Comp. example 7 | Compound No. 5 | Hydrogen gas |
| Comp. example 8 | Compound No. 9 | Hydrogen gas |
| Comp. example 9 | Comparative compound 1 | Compound No. 22 |
| Comp. example 10 | Comparative compound 1 | Compound No. 23 |
| Comp. example 11 | Comparative compound 1 | Compound No. 28 |
| Comp. example 12 | Comparative compound 1 | Compound No. 29 |

(Evaluation)

The thin-film composition of the thin films obtained in Examples 1-16 and Comparative examples 1-12 was checked by X-ray photoelectron spectroscopy, to ascertain whether a metallic ruthenium thin film was obtained. The results are given in Table 3.

TABLE 3

| | Thin film to be analyzed | Film composition |
|---|---|---|
| Evaluation example 1 | Example 1 | Metallic ruthenium |
| Evaluation example 2 | Example 2 | Metallic ruthenium |
| Evaluation example 3 | Example 3 | Metallic ruthenium |
| Evaluation example 4 | Example 4 | Metallic ruthenium |
| Evaluation example 5 | Example 5 | Metallic ruthenium |
| Evaluation example 6 | Example 6 | Metallic ruthenium |
| Evaluation example 7 | Example 7 | Metallic ruthenium |
| Evaluation example 8 | Example 8 | Metallic ruthenium |
| Evaluation example 9 | Example 9 | Metallic ruthenium |
| Evaluation example 10 | Example 10 | Metallic ruthenium |
| Evaluation example 11 | Example 11 | Metallic ruthenium |
| Evaluation example 12 | Example 12 | Metallic ruthenium |
| Evaluation example 13 | Example 13 | Metallic ruthenium |
| Evaluation example 14 | Example 14 | Metallic ruthenium |
| Evaluation example 15 | Example 15 | Metallic ruthenium |
| Evaluation example 16 | Example 16 | Metallic ruthenium |
| Comp. evaluation example 1 | Comp. example 1 | Composite film of metallic ruthenium and ruthenium oxide |
| Comp. evaluation example 2 | Comp. example 2 | Composite film of metallic ruthenium and ruthenium oxide |
| Comp. evaluation example 3 | Comp. example 3 | Composite film of metallic ruthenium and ruthenium oxide |
| Comp. evaluation example 4 | Comp. example 4 | Composite film of metallic ruthenium and ruthenium oxide |
| Comp. evaluation example 5 | Comp. example 5 | Composite film of metallic ruthenium and ruthenium oxide |
| Comp. evaluation example 6 | Comp. example 6 | Composite film of metallic ruthenium and ruthenium oxide |
| Comp. evaluation example 7 | Comp. example 7 | Composite film of metallic ruthenium and ruthenium oxide |
| Comp. evaluation example 8 | Comp. example 8 | Composite film of metallic ruthenium and ruthenium oxide |
| Comp. evaluation example 9 | Comp. example 9 | Metallic ruthenium not detected. |
| Comp. evaluation example 10 | Comp. example 10 | Metallic ruthenium not detected. |
| Comp. evaluation example 11 | Comp. example 11 | Metallic ruthenium not detected. |
| Comp. evaluation example 12 | Comp. example 12 | Metallic ruthenium not detected. |

The results in Table 3 reveal that high-quality metallic ruthenium could be produced in all of Evaluation examples 1 to 16. On the other hand, formation of a composite film of metallic ruthenium and ruthenium oxide could be observed in Comparative evaluation examples 1 to 8. Moreover, no metallic ruthenium could be found in the results of component analysis of Comparative evaluation examples 9 to 12.

The invention claimed is:

1. A method for producing a metallic ruthenium thin film on a substrate by atomic layer deposition, the method comprising:

(A) a step of introducing a feedstock gas containing a ruthenium compound represented by Formula (1) into a treatment atmosphere, and allowing the ruthenium compound represented by Formula (1) to deposit on the substrate; and (B) a step of introducing a reactive gas containing at least one of compounds represented by Formula (2) and Formula (3) into the treatment atmosphere, and allowing the reactive gas to react with the ruthenium compound represented by Formula (1) deposited on the substrate,

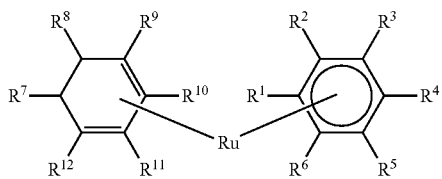

(1)

(in the formula, $R^1$ to $R^{12}$ each independently represent hydrogen or a C1 to C5 alkyl group)

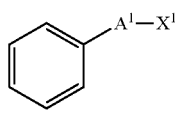

(2)

(in the formula, $A^1$ represents a C1 to C5 alkanediyl group, and $X^1$ represents a halogen atom)

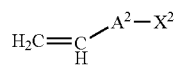

(3)

(in the formula, $A^2$ represents a C1 to C5 alkanediyl group, and $X^2$ represents a halogen atom).

2. The method for producing a metallic ruthenium thin film of claim 1, wherein a temperature of the substrate in the step (B) lies in a range from 100° C. to 500° C.

3. The method for producing a metallic ruthenium thin film of claim 2, comprising a step of discharging a gas of the treatment atmosphere between the step (A) and the step (B), and/or after the step (B).

4. The method for producing a metallic ruthenium thin film of claim 3, wherein a film formation cycle comprising the step (A) and the step (B) is repeated in this order.

5. The method for producing a metallic ruthenium thin film of claim 2, wherein a film formation cycle comprising the step (A) and the step (B) is repeated in this order.

6. The method for producing a metallic ruthenium thin film of claim 1, comprising a step of discharging a gas of the treatment atmosphere between the step (A) and the step (B), and/or after the step (B).

7. The method for producing a metallic ruthenium thin film of claim 6, wherein a film formation cycle comprising the step (A) and the step (B) is repeated in this order.

8. The method for producing a metallic ruthenium thin film of claim 1, wherein a film formation cycle comprising the step (A) and the step (B) is repeated in this order.

* * * * *